United States Patent
Jain et al.

(10) Patent No.: US 7,825,025 B2
(45) Date of Patent: Nov. 2, 2010

(54) METHOD AND SYSTEM FOR IMPROVED NICKEL SILICIDE

(75) Inventors: Amitabh Jain, Allen, TX (US); Peijun Chen, Dallas, TX (US); Jorge A. Kittl, Waterloo (BE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/959,674

(22) Filed: Oct. 4, 2004

(65) Prior Publication Data
US 2006/0073656 A1    Apr. 6, 2006

(51) Int. Cl.
*H01L 21/44* (2006.01)
*H01L 21/477* (2006.01)

(52) U.S. Cl. .................. 438/683; 438/233; 438/655; 438/656; 438/664; 257/E21.619; 257/E21.634

(58) Field of Classification Search .................. 438/233, 438/661, 664, 586, 655, 683, 656, 660, 684; 257/E21.619, E21.634
See application file for complete search history.

(56) References Cited

U.S. PATENT DOCUMENTS

| | | | | |
|---|---|---|---|---|
| 6,133,124 A | * | 10/2000 | Horstmann et al. | 438/525 |
| 6,204,132 B1 | | 3/2001 | Kittl et al. | |
| 6,376,372 B1 | * | 4/2002 | Paranjpe et al. | 438/682 |
| 2005/0250317 A1 | * | 11/2005 | Koh et al. | 438/653 |
| 2005/0250319 A1 | * | 11/2005 | Carruthers et al. | 438/655 |

* cited by examiner

*Primary Examiner*—Julio J Maldonado
(74) *Attorney, Agent, or Firm*—Jacqueline J. Garner; Wade J. Brady, III; Frederick J. Telecky, Jr.

(57) ABSTRACT

According to one embodiment of the invention, a method for nickel silicidation includes providing a substrate having a source region, a gate region, and a drain region, forming a source in the source region and a drain in the drain region, annealing the source and the drain, implanting, after the annealing the source and the drain, a heavy ion in the source region and the drain region, depositing a nickel layer in each of the source and drain regions, and heating the substrate to form a nickel silicide region in each of the source and drain regions by heating the substrate.

18 Claims, 1 Drawing Sheet

US 7,825,025 B2

METHOD AND SYSTEM FOR IMPROVED NICKEL SILICIDE

TECHNICAL FIELD OF THE INVENTION

The present invention relates generally to the field of semiconductor devices and, more particularly, to a method and system for nickel silicide.

BACKGROUND OF THE INVENTION

Modern electronic equipment, such as televisions, radios, cell phones, and computers are generally constructed of solid state devices. Solid state devices include transistors, capacitors, resistors and the like. One type of transistor is a metal oxide semiconductor field effect transistor (MOSFET), such as NMOS, PMOS, or CMOS transistors. MOSFETs may be used in a myriad of electronic devices.

Increasingly, MOSFETs are made smaller to reduce the size and increase performance of electronic equipment. In addition, use of the devices in, for example, high performance logic requires faster operational speed. One way to achieve faster operational speed is to reduce the series resistance of the source, drain, and gate regions. This has been accomplished using metal silicide as a contact material. Titanium silicide, and then cobalt silicide, has been used in CMOS technology. Recently, nickel silicide seems to be the silicide of choice. However, because of the diffusion characteristics of nickel, problems may arise during the silicidation process, such as pipe defects.

SUMMARY OF THE INVENTION

According to one embodiment of the invention, a method for nickel silicidation includes providing a substrate having a source region, a gate region, and a drain region, forming a source in the source region and a drain in the drain region, annealing the source and the drain, implanting, after the annealing the source and the drain, a heavy ion in the source region and the drain region, depositing a nickel layer in each of the source and drain regions, and heating the substrate to form a nickel silicide region in each of the source and drain regions by heating the substrate.

Embodiments of the invention provide a number of technical advantages. Embodiments of the invention may include all, some, or none of these advantages. According to one embodiment, MOSFET performance is improved by a method of nickel silicidation that lowers sheet resistance and reduces pipe defects without increasing the thickness of the deposited nickel layer. In one embodiment, such advantages are achieved by amorphizing the silicon in the source and drain regions with a heavy ion. This amorphization method may be simple, effective, inexpensive, and CMOS compatible.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 4 of the drawings, in which like numerals refer to like parts.

Figure 1:
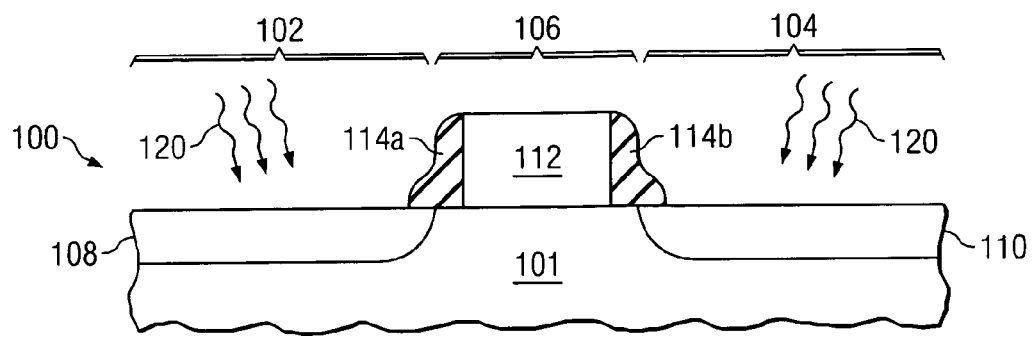
FIGS. 1 through 4 are a series of cross-sectional views illustrating various stages of nickel silicidation in accordance with one embodiment of the present invention.

FIG. 1 is a cross-sectional view illustrating a portion of a metal-oxide semiconductor field effect transistor ("MOSFET") 100 in accordance with one embodiment of the present invention. MOSFET 100, as used throughout this detailed description, represents a partially completed MOSFET, such as an NMOS, PMOS, CMOS, or other suitable semiconductor device. In the illustrated embodiment, MOSFET 100 includes a substrate 101, a source region 102 having a source 108, a drain region 104 having a drain 110, and a gate region 106 having a gate 112.

Substrate 101 may be formed from any suitable semiconductor material, such as silicon. For example, substrate 101 may be a silicon wafer, a silicon wafer with previously embedded devices, an epitaxial layer grown on a wafer, a semiconductor on insulation ("SOI") system, or other suitable substrates having any suitable crystal orientation.

Both source 108 and drain 110 may be formed in source region 102 and drain region 104, respectively, using any suitable techniques used in semiconductor processing, such as ion implantation. For example, if MOSFET 100 is a P-type transistor, then boron or other suitable P-type dopant may be implanted during the ion implantation process to form source 108 and drain 110. If MOSFET 100 is an N-type transistor, then arsenic, phosphorous, antimony, or other suitable N-type dopant may be implanted in substrate 101 during the ion implantation process to form source 108 and drain 110. Although not illustrated in FIG. 1, both source 108 and drain 110 may have heavily doped and lightly doped regions. After the ion implantation in source region 102 and drain region 104, an anneal process, as illustrated by arrows 120, is performed for diffusion of the dopant. Although this anneal process may be carried out at any suitable temperature for any suitable time period, in one embodiment of the invention, the annealing of source region 102 and drain region 104 is carried out at approximately 1050° C.

Gate 112 may be formed using any suitable growth and/or deposition techniques using semiconductor processing and may be formed from any suitable material, such as polysilicon. A pair of sidewalls 114a, 114b may also be formed using any suitable growth and/or deposition techniques using semiconductor processing and may be formed from any suitable dielectric materials, such as oxide, nitride, a combination of oxide and nitride, or other suitable materials.

Although not illustrated in FIG. 1, a cap oxide remains on substrate 101 in source 102 and drain region 104 after the formation of sidewalls 114a, 114b. This cap oxide needs to be removed sometime during the formation of MOSFET 100. This removal of the cap oxide could be performed via any suitable removal technique, such as etching, and may be performed before the ion implantation for source 108 and drain 110, after the annealing of source 108 and drain 110, or at another suitable time.

Figure 2:
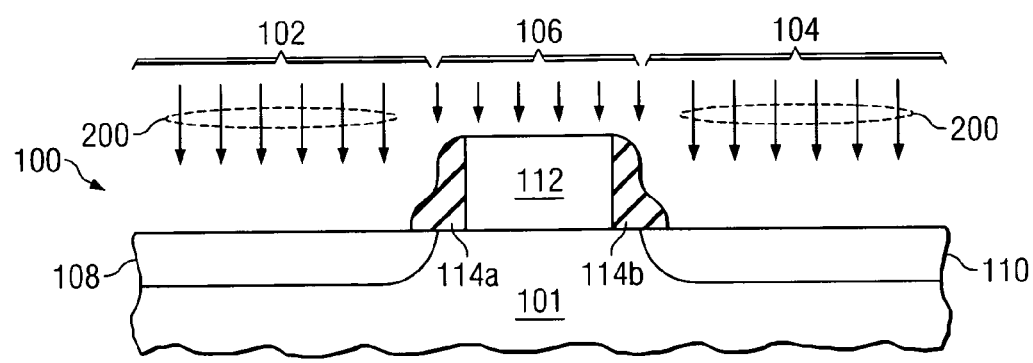

FIG. 2 is a cross-sectional view of MOSFET 100 illustrating the implantation of a heavy ion in source region 102 and drain region 104, as indicated by reference numeral 200. Although the implantation is illustrated in FIG. 2 as being perpendicular to substrate 101, the invention contemplates heavy ions being implanted at any suitable angle to substrate 101. According to the teachings of one embodiment of the invention, this implantation comes after the annealing of source 108 and drain 110 and may comprise any suitable heavy ion, such as antimony. Heavy ion as used in this detailed description means any ions being heavier than silicon ions. The implanting of heavy ions in source region 102 and drain region 104 amorphizes the silicon in source region 102 and drain region 104 (and the polysilicon in gate region 106) in order to destroy the crystalline silicon, which destroys the defects associated therewith. As described in greater detail below, this amorphization of the silicon improves the nickel silicidation process for MOSFET 100 by reducing the likelihood of potential problems associated with the nickel silicidation process.

Although the heavy ion may be implanted using any suitable parameters, in one embodiment, the heavy ion is implanted in source region 102 and drain region 104 utilizing a dosage of between 5e13 ions/cm$^2$ and 1e15 ions/cm$^2$ at an energy level of between 3 keV and 40 keV. In a more particular embodiment of the invention, the dosage is approximately 2e14 ions/cm$^2$ at an energy level of approximately 15 keV.

Although not illustrated in FIG. 2, after the implantation of heavy ions, one or more cleaning processes may be performed for MOSFET 100. For example, a post-implant clean, such as SPM+SC1 may performed. Other cleaning processes may include a hydrofluoric acid dip, an NF3 clean, and/or a pre-sputter etch ("PSE").

Figure 3:
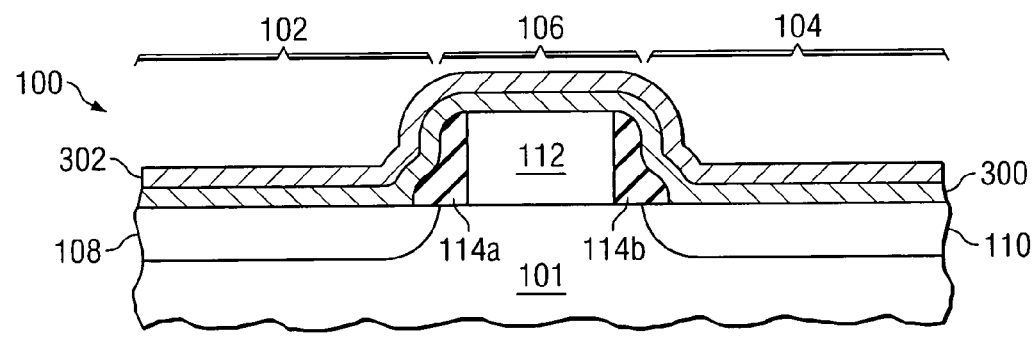
Figure 4:
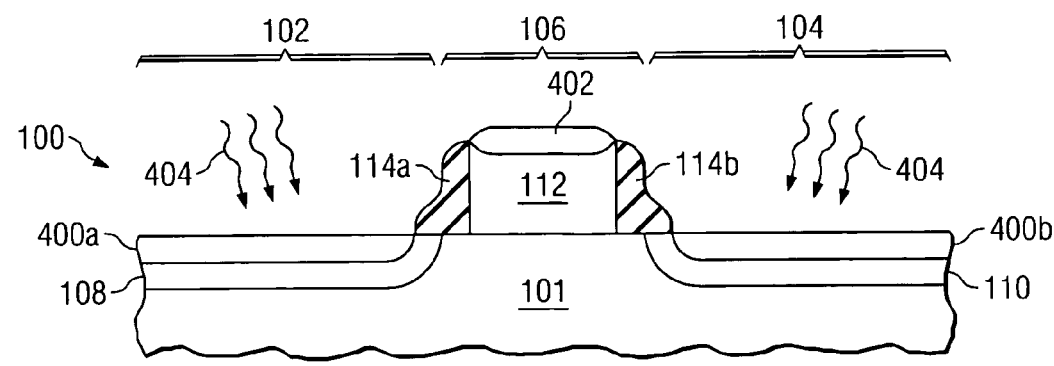

FIGS. 3 and 4 illustrate a nickel silicidation process according to one embodiment of the invention. According to FIG. 3, a nickel layer 300 is formed outwardly from source 108, drain 110, gate 112, and sidewalls 114a, 114b. In addition, a titanium nitride layer 302 is formed outwardly from nickel layer 300.

Nickel layer 300 may be formed using any suitable growth and/or deposition techniques used in semiconductor processing. In one embodiment, a thickness of nickel layer 300 is between 5 and 30 nanometers. In a more particular embodiment of the invention, a thickness of nickel layer 300 is between 5 and 15 nanometers. Titanium nitride layer 302 may also be formed from any suitable growth and/or deposition techniques used in semiconductor processing. In addition, titanium nitride layer 302 may have any suitable thickness. Titanium nitride layer 302 functions to keep the nickel from oxidizing before any stripping process of unreacted nickel.

Referring to FIG. 4, a pair of nickel silicide regions 400a, 400b are shown to be formed in source 108 and drain 110, respectively. A nickel silicide region 402 is also illustrated as being formed in gate 112. These nickel silicide regions are accomplished by heating substrate 101, as indicated by arrows 404, which diffuses the nickel in nickel layer 300 into the material, thereby forming contacts in source 108, drain 110, and gate 112. Nickel silicide regions 400a, 400b and 402 may have any suitable thickness. In one embodiment, substrate 101 is heated to a temperature of between 250° C. and 550° C. for a time period between 0.1 seconds and 300 seconds. In a more particular embodiment of the invention, substrate 101 is heated to a temperature of between 300° C. and 350° C. for a time period between 0.1 seconds and 150 seconds.

In some embodiments of the invention, after the silicidation process, any unreacted nickel from nickel layer 300 is stripped using any suitable stripping technique using semiconductor processing. In addition, any titanium nitride left over from titanium nitride layer 302 is also stripped away during the same process. After the stripping of the unreacted nickel and titanium nitride, a second silicide anneal process may be performed. In some embodiments, this additional silicide anneal forms nickel monosilicide from nickel-rich silicide. In one embodiment, this additional silicide anneal process is performed at a temperature of between 300° C. and 550° C. for a time period of between 0.1 seconds and 300 seconds. In a more particular embodiment of the invention, this additional silicide anneal process is performed at a temperature of approximately 400° C. for a time period of approximately thirty seconds.

In some embodiments of the invention, a solid phase epitaxial ("SPE") regrowth process may be performed by heating substrate 101 in order to recrystallize any amorphous silicon that did not silicidize during the nickel silicidation process. In one embodiment, this SPE anneal process may be performed by heating substrate 101 at a temperature between 550° C. and 750° C. for a time period of between one second and 30 minutes. In a more particular embodiment of the invention, the SPE anneal process is performed by heating substrate 101 to a temperature of between 550° C. to 600° C. for a time period of between 10 seconds and 15 minutes. Other suitable process parameters are contemplated by the present invention.

Thus, embodiments of the invention may facilitate increased MOSFET performance by improving the nickel silicidation process. The nickel silicidation process described above may lower sheet resistance and may reduce pipe defects without increasing the thickness of the deposited nickel layer. Amorphization of the silicon is simple, effective, inexpensive, and CMOS compatible.

Although embodiments of the invention and their advantages are described in detail, a person skilled in the art could make various alterations, additions, and omissions without departing from the spirit and scope of the present invention as defined by the appended claims.

What is claimed is:

1. A method for nickel silicidation, comprising:
   providing a substrate having a source region, a gate region, and a drain region;
   forming a source in the source region and a drain in the drain region;
   annealing the source and the drain;
   implanting, after annealing the source and the drain, a heavy ion in the source region and the drain region;
   depositing a nickel layer in each of the source and drain regions;
   heating the substrate to form a nickel-rich silicide region in each of the source and drain regions by heating the substrate;
   re-heating the substrate at a first temperature of between 300° C. and 550° C. for a time period of between 0.1 second and 300 seconds to form the nickel monosilicide; and
   after forming the nickel monosilicide, causing solid phase epitaxial regrowth of a portion of the substrate by annealing the substrate at a second temperature of between 550° C. and 750° C. to recrystallize amorphous silicon that did not silicidize in forming the nickel silicide regions.

2. The method of claim 1 further comprising removing a cap oxide in the source and drain regions either before forming the source and the drain, after annealing the source and the drain, or after implanting the heavy ion.

3. The method of claim 1 further comprising forming a titanium nitride layer outwardly from the nickel layer before heating the substrate.

4. The method of claim 1 wherein implanting the heavy ion comprises implanting antimony.

5. The method of claim 1 wherein implanting the heavy ion in the source region and the drain region further comprises utilizing a dosage of between 5e13 ions/cm$^2$ and 1e15 ions/cm$^2$ at an energy level of between 3 keV and 40 keV.

6. The method of claim 1 wherein implanting the heavy ion in the source region and the drain region further comprises utilizing a dosage of approximately 2e14 ions/cm$^2$ at an energy level of approximately 15 keV.

7. The method of claim 1 wherein the nickel layer has a thickness of between five and thirty nm.

8. The method of claim 1 wherein the nickel layer has a thickness of between five and fifteen nm.

9. The method of claim 1 wherein heating the substrate further comprises heating the substrate to a temperature of between 250° C. and 550° C. for a time period of between 0.1 second and 300 seconds.

10. The method of claim 1 further comprising:
removing unreacted nickel from the source and drain regions after heating the substrate.

11. The method of claim 1 wherein the implanting is performed at an angle to the substrate.

12. A method for nickel silicidation, comprising:
providing a substrate having a source region, a gate region, and a drain region;
forming a source in the source region and a drain in the drain region;
annealing the source and the drain;
implanting, after annealing the source and the drain, antimony in the source region and the drain region utilizing a dosage of between 5e13 Sb/cm$^2$ and 1e15 Sb/cm$^2$ at an energy level of between 3 keV and 40 key;
depositing a nickel layer in each of the source and drain regions;
forming a titanium nitride layer having a thickness of between five and thirty nm outwardly from the nickel layer before heating the substrate;
performing a first heating step to heat the substrate to a temperature of between 250° C. and 550° C. for a time period of between 0.1 second and 300 seconds to form a nickel-rich silicide region in each of the source and drain regions by heating the substrate;
performing a second heating step to re-heat the substrate to form nickel monosilicide from nickel-rich silicide; and
after forming the nickel monosilicide, performing a third heating step to cause solid phase epitaxial regrowth of a portion of the substrate by annealing the substrate at a temperature of between 550° C. and 750° C. to recrystallize amorphous silicon that did not silicidize in forming the nickel silicide regions.

13. The method of claim 12 further comprising removing a cap oxide in the source and drain regions either before forming the source and the drain, after annealing the source and the drain, or after implanting the heavy ion.

14. The method of claim 12 wherein implanting the heavy ion in the source region and the drain region further comprises utilizing a dosage of approximately 2e14 ions/cm$^2$ at an energy level of approximately 15 keV.

15. The method of claim 12 further comprising:
removing unreacted nickel from the source and drain regions after heating the substrate; and then
re-heating the substrate at a temperature of between 300° C. and 550° C. for a time period of between 0.1 second and 300 seconds to form nickel monosilicide from nickel-rich silicide.

16. The method of claim 15, wherein the solid phase epitaxial regrowth occurs after re-heating the substrate.

17. A method for nickel silicidation, comprising:
providing a substrate having a source region, a gate region, and a drain region;
forming a source in the source region and a drain in the drain region;
annealing the source and the drain;
after annealing the source and the drain, implanting antimony in the source region and the drain region utilizing a dosage of between 5e13 Sb/cm$^2$ to less than 1e14 Sb/cm$^2$ at an energy level of between 3 keV to less than 5 keV;
depositing a nickel layer in each of the source and drain regions;
heating the substrate to a temperature of between 250° C. and less than 400° C. for a time period of between greater than 120 seconds and less than 300 seconds to form a nickel-rich silicide in each of the source and drain regions;
re-heating the substrate to form nickel monosilicide from nickel-rich silicide and
after forming the nickel monosilicide, causing solid phase epitaxial regrowth of a portion of the substrate by annealing the substrate at a temperature of between 550° C. and 750° C. to recrystallize amorphous silicon that did not silicidize informing the nickel silicide regions, wherein the temperature range of said re-heating step differs from a temperature range of said causing solid phase epitaxial growth step.

18. The method of claim 17 further comprising:
removing unreacted nickel from the source and drain regions after heating the substrate; and then
re-heating the substrate at a temperature of between 300° C. and 550° C. for a time period of between 0.1 second and 300 seconds to form nickel monosilicide from nickel-rich silicide.

* * * * *